United States Patent [19]

Blackburn et al.

[11] Patent Number: 5,164,901

[45] Date of Patent: Nov. 17, 1992

[54] METHOD AND APPARATUS FOR TESTING A VEHICLE OCCUPANT RESTRAINT SYSTEM

[75] Inventors: Brian K. Blackburn, Rochester; Joseph F. Mazur, Washington; Scott B. Gentry, Shelby Township, all of Mich.

[73] Assignee: TRW Vehicle Safety Systems Inc., Lyndhurst, Ohio

[21] Appl. No.: 802,607

[22] Filed: Dec. 5, 1991

[51] Int. Cl.⁵ .............................................. B60R 21/32
[52] U.S. Cl. ............................ 364/424.05; 340/436; 280/735; 180/271; 180/282; 307/10.1
[58] Field of Search .................. 364/424.05; 340/436, 340/438; 280/728, 734, 735; 180/282, 232, 271; 307/9.1, 10.1

[56] References Cited

U.S. PATENT DOCUMENTS

| | | | |
|---|---|---|---|
| 3,703,702 | 11/1972 | Arai | 280/735 |
| 3,863,208 | 1/1975 | Balban | 280/735 |
| 3,921,129 | 11/1975 | Sumida | 280/735 |
| 4,059,822 | 11/1977 | Toshioka et al. | 280/735 |
| 4,243,971 | 1/1981 | Suchowerskyj et al. | 340/436 |
| 4,410,875 | 10/1983 | Spies et al. | 280/735 |
| 4,835,513 | 5/1989 | McCurdy et al. | 280/735 |
| 4,853,623 | 8/1989 | Sterler et al. | 280/735 |
| 4,873,452 | 10/1989 | Morota et al. | 307/10.1 |
| 5,045,835 | 9/1991 | Masegi et al. | 280/734 |
| 5,107,245 | 4/1992 | Gesper et al. | 364/424.05 |

Primary Examiner—Gary Chin
Attorney, Agent, or Firm—Tarolli, Sundheim & Covell

[57] ABSTRACT

An apparatus tests an actuatable occupant restraint system for a vehicle. The restraint system has an actuatable occupant restraint device and a crash sensor for outputting a signal having an identifiable electrical characteristic indicative of a specific type of vehicle crash condition. The restraint system also has a processing circuit connected to the crash sensor for providing an actuation signal to the occupant restraint device when the crash sensor signal indicates an occurrence of a predetermined type of vehicle crash condition. The test apparatus comprises a memory device connected to the processing circuit for storing a plurality of simulated crash sensor signals. Each stored simulated crash sensor signal is indicative of a predetermined type of vehicle crash condition. A disabling circuit is connected to the output of the processing circuit for disabling electrical communication between the output of the processing circuit and the actuatable restraint device. A controller is connected to the memory device, the disabling circuit, and the output of the processing circuit for controlling the disabling of the output from the processing circuit, applying simulated stored signals to the processing circuit, monitoring the output of the processing circuit when a simulated stored signal is applied to the processing circuit, and determining if the output signal from the processing circuit correctly responds to such applied simulated crash signal. A warning indicator is connected to the controller. The controller actuates the warning indicator when the controller determines the processing circuit has not properly responded to an applied simulated crash signal from the memory device.

7 Claims, 9 Drawing Sheets

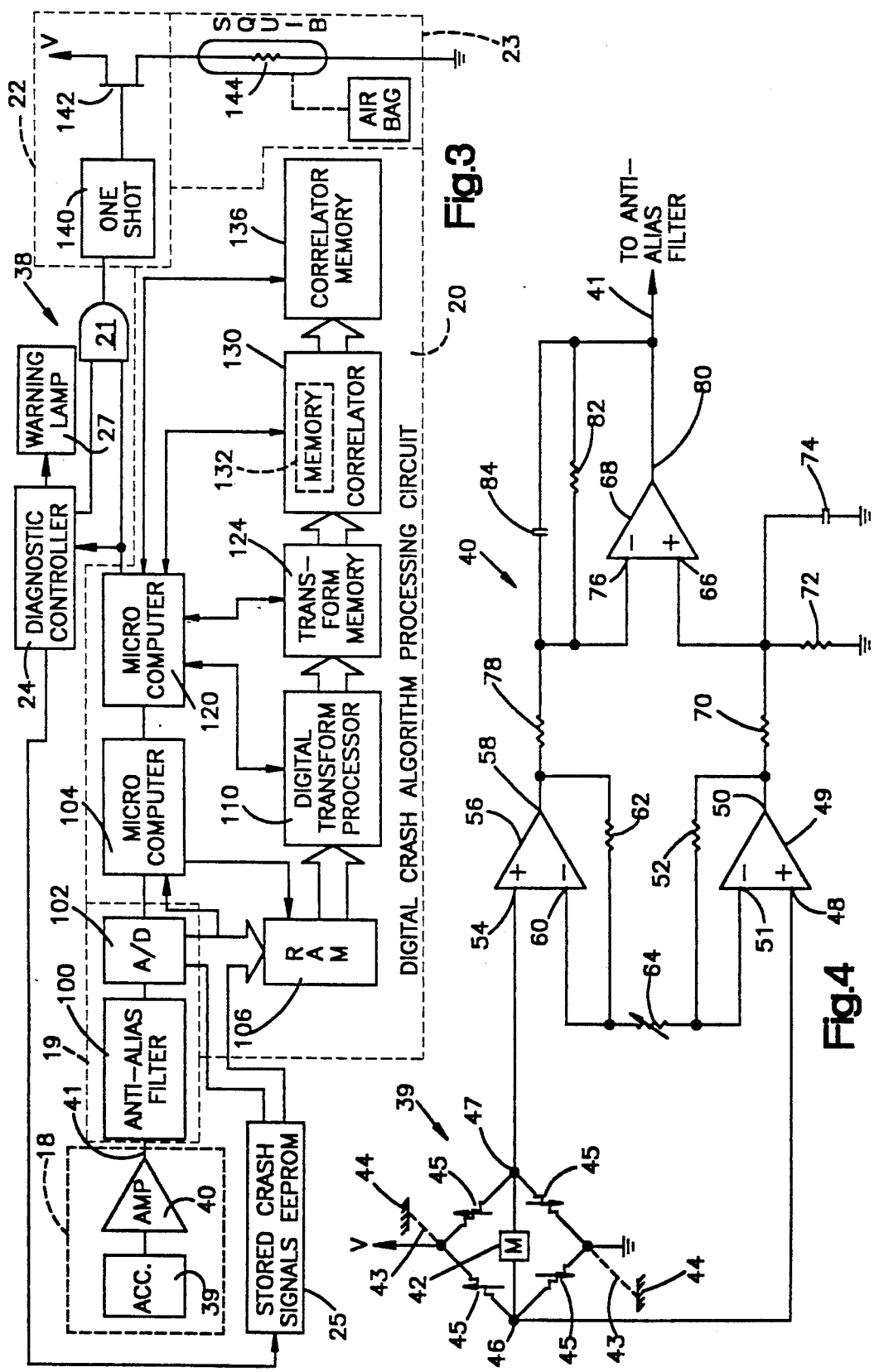

METHOD AND APPARATUS FOR TESTING A VEHICLE OCCUPANT RESTRAINT SYSTEM

TECHNICAL FIELD

The present invention is directed to an actuatable occupant restraint system for a vehicle and is particularly directed to a method and apparatus for testing the operativeness of such a restraint system.

BACKGROUND OF THE INVENTION

Actuatable occupant restraint systems for vehicles are well known in the art. One particular type of actuatable occupant restraint system includes an inflatable air bag mounted within the occupant compartment of the vehicle at a location designed to protect the occupant. The air bag has an associated, electrically actuatable igniter, referred to as a squib. Such a system further includes a crash sensing device such as an inertia sensor for sensing the deceleration of the vehicle. When the inertia sensor is subjected to a deceleration force greater than a predetermined value, the inertia sensor closes an electrical switch. The electrical switch an the squib are connected in series across a source of electrical energy, such as the vehicle battery. When the electrical switch is closed as a result of vehicle deceleration greater than a predetermined amount, electric current of sufficient magnitude and duration passes through the squib so as to cause the squib to ignite. The squib, when ignited, ignites a combustible gas generating composition or pierces a container of pressurized gas operatively connected to the air bag, which results in inflation of the air bag.

Many known inertia sensing devices used in actuatable occupant restraint systems are mechanical in nature. Such mechanical inertia sensing devices are typically mounted to the vehicle and include a pair of mechanically actuatable, electrical switch contacts and a resiliently biased weight. The weight is arrange such that when the vehicle decelerates, the weight physically moves relative to its mounting. The greater the amount and duration of the deceleration, the further the weight moves against the bias force. The switch contacts are mounted relative to the biased weight such that, when the weight moves a predetermined distance, the weight moves over or against the switch contacts causing them to close. The switch contacts, when closed, connect a squib to a source of electrical energy sufficient to ignite the squib.

Still other known actuatable occupant restraint systems for vehicles include an electrical transducer or accelerometer for sensing vehicle deceleration. Such systems include a monitoring or evaluation circuit connected to the output of the transducer. The transducer provides an electrical signal having a value indicative of the occurrence of a vehicle crash condition. The monitoring circuit processes the transducer output signal and controls whether or not the air bag is deployed.

One type of monitoring circuit integrates the transducer output signal. If the output of the integrator exceeds a predetermined value, thereby indicating crash violence greater than a certain amount, an electrical switch is actuated so as to connect electrical energy to the squib.

One example of a occupant restraint system using an electrical accelerometer is disclosed in U.S. Pat. No. 3,870,894 to Brede, et al. ("the '894 patent"). The '894 patent discloses a system which includes an accelerometer, an evaluation circuit connected to the accelerometer, and an ignition circuit or squib connected to an output of the evaluation circuit. The accelerometer includes a piezoelectric transducer that provides a electrical output signal having a value proportional to the vehicle deceleration. The evaluation circuit includes an integrator electrically coupled to the output of the accelerometer through an amplifier. The output of the integrator is an electrical signal having a value proportional to the integral of the deceleration signal. A trigger circuit is connected to the output of the integrator. When the output of the integrator reaches a predetermined value, the trigger circuit actuates a time delay circuit. The time delay circuit begins to time out a predetermined time period. After the time period is timed out, the air bag ignition circuit is energized.

It has been discovered that it is not desirable to inflate a vehicle air bag under all types of crash conditions to which the vehicle is subjected. It is not desirable, for example, to inflate the air bag during certain types of low speed crashes. Such a crash is referred to as a non-deployment crash. A non-deployment crash is one in which it is not necessary to deploy the vehicle air bag to protect a vehicle occupant. In a non-deployment crash condition, the vehicle's seat belts alone are sufficient to protect the occupant. Similarly, a deployment crash condition is one in which it is desirable to deploy the vehicle air bag to maximize protective restraint for the vehicle occupant.

The determination as to what crash conditions fall within the definition of a non-deployment crash is dependent upon various factors related to the type of vehicle. If, for example, a small or medium size vehicle were to hit a brick wall at 30 miles per hour, such a crash condition would be a deployment crash condition. On the other hand, if a large vehicle traveling eight miles per hour hits a parked vehicle, such a crash would be considered a non-deployment crash condition that would not require deployment of the airbag to protect the vehicle occupants. The vehicle seat belts alone would be sufficient to insure occupant safety in such a crash.

During a non-deployment crash condition, a typical accelerometer would provide an output signal indicating a large deceleration is occurring. In an actuatable occupant restraint system using an integrator connected to an accelerometer wherein the integrator is the only determination or evaluation device, the air bag would be inflated as soon as a speed differential occurs which is large enough to cause the integrator output to exceed a predetermined limit. If the threshold level for triggering deployment of the bag were increased so that the system did not inflate during certain crash conditions, the resulting threshold may be so high that in some types of deployment crashes, e.g., certain pole and angled crashes, the bag would be deployed too late (if at all) to provide adequate occupant protection.

Monitoring and evaluation circuits have been developed that are able to measure the energy of the crash condition and to distinguish and identify a specific type of crash condition to which a vehicle is subjected. These monitoring and evaluation circuits are digital, analog, or a hybrid of analog and digital.

U.S. Pat. No. 5,034,891 to Blackburn et al. ("the '891 patent") discloses an evaluation circuit that monitors the output of a vehicle crash sensor and determines if the vehicle is subjected to a particular type of crash condition. The '891 patent discloses a system including a crash sensor that provides a vibratory output signal having particular frequency components which have been empirically determined, for that type of vehicle, to be indicative of a particular type of crash condition. The vibratory signal is integrated by the evaluation circuit. The vibratory signal is also filtered to determine if empirically determined frequency components indicative of certain types of crash conditions are present. The output of the filter is summed with the output of the integrator so that if the vehicle is in a predetermined type of crash condition, the airbag is deployed more quickly.

Known diagnostic circuits for actuatable restraint systems have only been concerned with the integrity of the electrical connections between the various components that make up the actuation circuit and with the values of the electrical components that make up the actuation circuit. In an actuatable restraint circuit that identifies a particular type of crash condition, based upon the output of the crash sensor signal, it is desirable to determine if the evaluation circuit will properly respond to various input signals from the sensor that are indicative of different types of crash conditions.

SUMMARY OF THE INVENTION

The present invention provides a method and apparatus for testing an actuatable occupant restraint system. In accordance with the present invention, the actuation circuit is disabled during power-up of the vehicle while various simulated crash signals are applied to an evaluation circuit of the occupant restraint system. A warning device is actuated if the evaluation circuit does not properly respond to an applied simulated crash signal.

In accordance with the present invention, an apparatus is provided for testing an actuatable occupant restraint system of a type having an actuatable occupant restraining device and a crash sensor that outputs a signal having an electrical characteristic indicative of a specific type of vehicle crash condition. The restraint system also comprises a processing circuit for outputting an actuation signal to the occupant restraint device when the crash sensor signal indicates an occurrence of a predetermined type of vehicle crash condition. The testing apparatus comprises means for storing a plurality of simulated crash sensor signals. Each stored simulated crash sensor signal is indicative of a predetermined type of vehicle crash condition. The apparatus also comprises means for disabling electrical communication between an output of the processing circuit and the actuatable occupant restraint device. The apparatus further includes means for applying the stored simulated signals to an input of the processing circuit. Means are provided for monitoring the output of the processing circuit when a stored simulated crash sensor signal is applied to the processing circuit. Also included in the apparatus are means for determining if the monitored output signal from the processing circuit indicates that the processing circuit correctly responded to an associated, applied simulated crash signal and for outputting a signal when the response is not correct. The apparatus further includes means for providing a warning indication if the means for determining indicates that the processing circuit has not properly responded to an applied simulated crash signal.

In accordance with the present invention, a method is provided for testing an actuatable occupant restraint system of a type having an actuatable occupant restraining device and a crash sensor for outputting a signal having an electrical characteristic indicative of a specific type of vehicle crash condition. The restraint system also includes a processing circuit that outputs an actuation signal to the occupant restraint device when the crash sensor signal indicates an occurrence of a predetermined type of vehicle crash condition. The method comprises the steps of storing a plurality of simulated crash sensor signals. Each stored simulated crash sensor signal is indicative of a predetermined type of vehicle crash condition. The method also includes the step of disabling electrical communication between an output of the processing circuit and the actuatable occupant restraint device, and applying the stored simulated crash signals to an input of the processing circuit. The output of the processing circuit is monitored when a stored simulated crash sensor signal is applied to the processing circuit and a determination is made as to whether the output signal from the processing circuit is a correct response to such applied simulated crash signal. The method further includes the step of providing a warning indication if it is determined that the processing circuit has not properly responded to an applied simulated crash signal.

BRIEF DESCRIPTION OF THE DRAWINGS

Further features of the present invention will become apparent to those skilled in the art to which the present invention relates from reading the following specification with reference to the accompanying drawings, in which:

FIG. 3 is a schematic block diagram showing a passenger restraint control system including a digital crash algorithm processing circuit;

FIG. 4 is a schematic diagram of the accelerometer assembly shown in FIG. 3;

DETAILED DESCRIPTION OF THE PREFERRED EMBODIMENT

Figure 1:
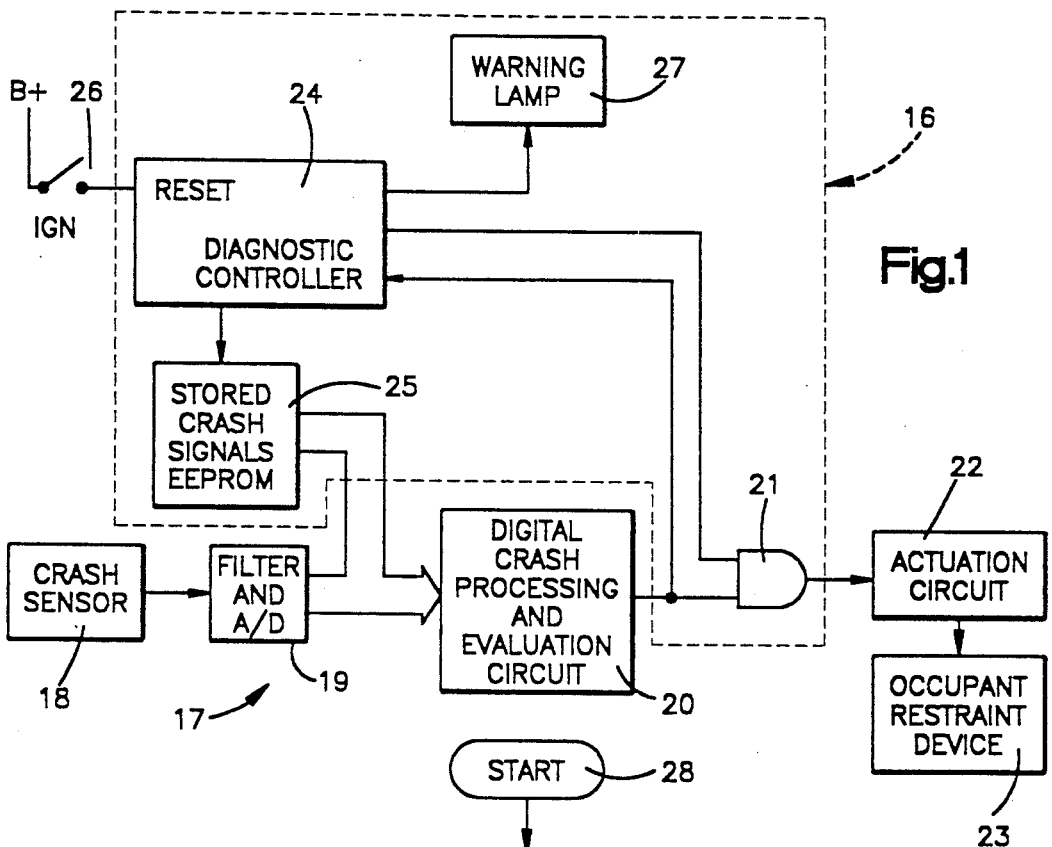
FIG. 1 is a schematic block diagram showing a diagnostic test circuit made in accordance with the present invention for an occupant restraint system having a digital crash algorithm processing circuit.

FIG. 1 shows a diagnostic test circuit 16 for use with an occupant restraint system 17. The occupant restraint system 17 is preferably an air bag restraint system including a crash sensor 18. The crash sensor 18 outputs an electrical signal having a value indicative of a particular type of crash condition for the associated vehicle. "Particular type of crash condition" means that for a particular vehicle, the output signal from the sensor provides an indication as to whether the vehicle is in a 8 MPH barrier crash, a 14 MPH pole crash, a 30 MPH angular hit with a barrier, etc.

The output of the sensor 18 is connected to a filter and A/D converter circuit 19 which filters and digitizes the output signal from the sensor 18. The output of circuit 19 is connected to a digital, processing and evaluation circuit 20. The circuit 20 is arranged so as to monitor and evaluate the signal from the sensor 18 and identify which one of a plurality of particular types of crash conditions the signal represents. If the sensor signal is determined, by the circuit 20, as being indicative of a crash condition for which it is desirable to actuate the passenger restraint device, the circuit 20 outputs an enable or actuation signal, i.e., a digital HIGH.

The output of the processing and evaluation circuit 20 is connected to one input of an AND gate 21. The output of the AND gate 21 is connected to an enable input of an actuation circuit 22. When the actuation circuit 22 receives an enable or actuation signal at its enable input, it provides an appropriate signal to actuate an actuatable occupant restraint device 23. In a preferred embodiment, the occupant restraint device 23 is an air bag of a type well known in the art. The occupant restraint device 23 includes a squib. When enabled, the actuation circuit provides electrical current of sufficient magnitude and duration to ignite the squib.

The output of the processing and evaluation circuit 20 is connected to a diagnostic controller 24. The diagnostic controller 24 has an output connected to the second input of the AND gate 21. If the controller 24 outputs a digital HIGH to the AND gate 21, the AND gate 21 is enabled so as to allow the output from the processing circuit 20 to control the actuation circuit 22. If the diagnostic controller 22 outputs a digital LOW to the AND gate 21, the output of the AND gate 21 remains LOW independent of the state of the output signal from the processing circuit 20.

The diagnostic controller 24 is controllably connected to a memory device 25, which is preferably an EEPROM. Stored in the memory 25 are a plurality of groups of digital signals, each group of signals being indicative of an associated type of crash condition for the vehicle type for which the diagnostic test circuit 16 designed. Preferably, certain of the groups of stored crash signals are indicative of a type of crash condition for which it is not desirable to actuate the occupant restraint device. Others of the stored crash signals are indicative of a type of crash condition for which it is desirable to actuate the occupant restraint device.

The output of the memory 25 is connected to the input of the processing circuit 20. Preferably, the output of the filter and A/D converter 19 and the output of the memory 25 are ORed together. The processing circuit 20 responds to a crash input signal whether it comes from circuit 19 or from the memory 25.

The diagnostic controller 24 has its reset input connectable to the vehicle battery (B+) through an ignition switch 26 so that the diagnostic controller is reset each time the vehicle is started. When reset, the diagnostic controller 24 outputs a digital LOW to the AND gate 21 effectively to disable the actuation circuit 22, i.e., the output from the processing circuit 20 is blocked from the actuation circuit 22. Then, the diagnostic controller 24 commands the memory 25 to begin outputting its stored signals, each group of signals being indicative of an associated type of vehicle crash condition.

The diagnostic controller 24 monitors the output from the processing circuit 20 and determines if the processing circuit 20 has properly responded to an applied crash signal. The diagnostic controller 24 does this for each of the crash signals stored in the memory 25 and applied to the circuit 20. If the output of the processing circuit 20 indicates an incorrect response to an applied stored crash signal, the controller 24 enables a warning lamp 27. When the warning lamp 27 is energized, such occurrence provides an indication to the vehicle operator that an error or fault condition exists in with the occupant restraint system. If the processing circuit correctly respond to each of the applied stored crash signals, the controller 24 outputs a digital HIGH to the AND gate 21 so as to enable the AND gate 21. The diagnostic controller 24 performs this diagnostic test at each start up of the vehicle, as sensed by the closure of switch 26, and only at each start up.

Figure 2:
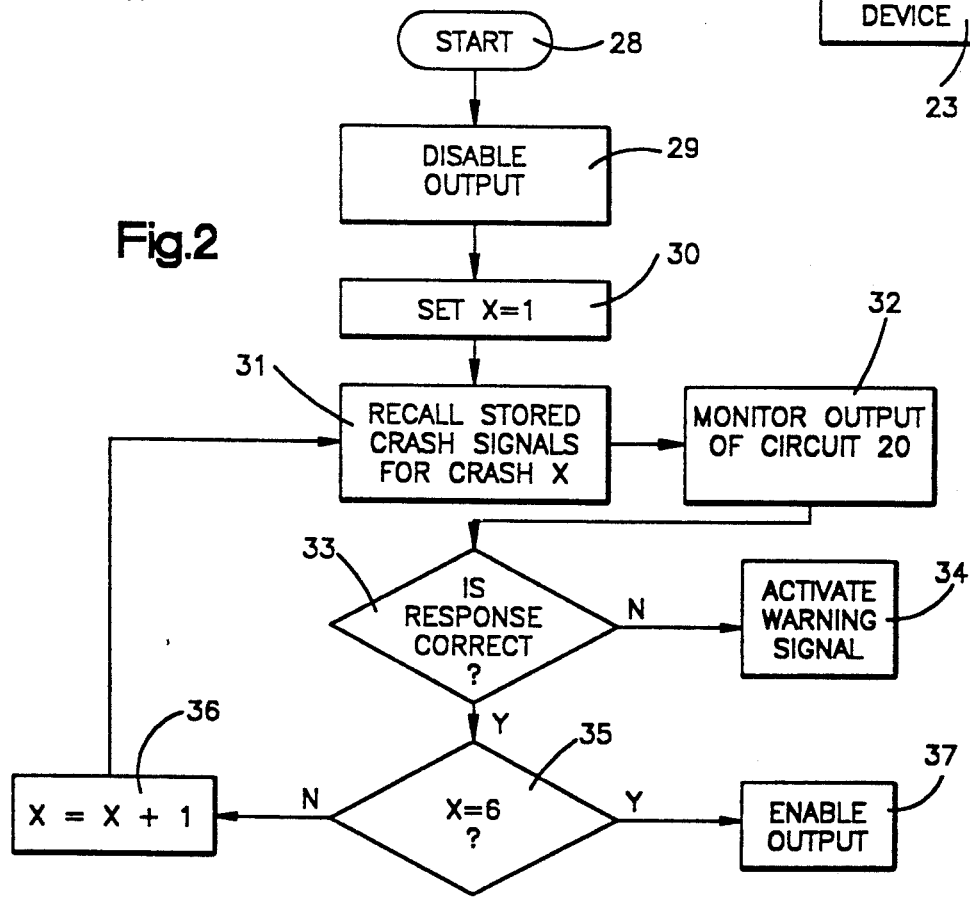
FIG. 2 is a flow chart depicting a control arrangement for the diagnostic circuit shown in FIG. 1.

FIG. 2 illustrates the control process followed for diagnostic testing of the occupant restraint system 17 at each start-up of the vehicle. Preferably, the controller 24 is a microcomputer having an internal memory. At step 28, the controller 24 is reset by the closing of the ignition switch 26. At reset, the controller 24 clears internal memory locations, sets initial parameters, etc., in a manner well known in the art. In step 29, the controller 24 outputs a digital LOW to the AND gate 21, thereby preventing or blocking an actuation signal from the processing circuit 20 from enabling the actuation circuit 22.

In step 30, the controller 24 sets a parameter X equal to 1. The parameter X was set equal to zero in the start step 28. The controller 24 then sends a command to the memory 25, in step 31, to recall a first group of stored crash signals indicative of a crash condition number 1. The controller 24 then monitors the output from the processing circuit 20 in step 32. In step 33, a determination is made as to whether the output from the processing and evaluation circuit 20 is a correct response for the applied simulated crash signals, i.e., crash condition number 1. For example, if the signals for the crash condition number 1 output from the memory 25 are indicative of an 8 MPH pole crash, the output from the processing and evaluation circuit 20 should be a digital LOW. If the circuit 20 outputs a digital HIGH for crash condition number 1, this is an incorrect response. If the determination in step 33 is negative, the process proceeds to step 34 where the warning lamp 27 is energized.

If the determination in step 33 is affirmative, the process proceeds to step 35 where a determination is made as to whether the value of parameter X is equal to 6. If the determination is negative, the value of parameter X is updated in step 36 to X=X+1. The process then loops back to step 31. The process stays in the loop of steps 31, 32, 33, 35, and 36 until 6 crash signals are recalled from the memory 25. If all responses from the circuit 20 are correct for all 6 of the applied groups of crash signals recalled from the memory 25, the determination in step 35 is affirmative and the process proceeds to step 37. In step 37, the controller 24 outputs a digital HIGH to the AND gate 21, thereby enabling the output of the processing circuit 20 to control actuation of the occupant restraint device 23.

FIGS. 3-13 depict a specific embodiment of an occupant restraint system having a test circuit made in accordance with the present invention and including a specific digital crash processing circuit 20. Referring to FIG. 3, an apparatus 38 is shown for controlling the actuation of an air bag restraint system. The crash sensor 18 includes an accelerometer or vibratory transducer 39 electrically connected to an amplifier 40. The output 41 of the amplifier 40 is an oscillating signal having frequency components. Each of various types of vehicle crash conditions results in a accelerometer output signal having particular, identifiable frequency components.

Referring to FIG. 4, the accelerometer 39 includes a mass 42 suspended by a cantilever support arrangement 43 secured to a housing 44. The housing 44 is securable to the vehicle. Four variable resistors 45 are mounted to the cantilever support arrangement. The resistors 45 are electrically connected in a Wheatstone bridge configuration between electrical ground and a source of electrical energy V.

When the mass 42 of the accelerometer moves relative to its housing 44, as happens during a vehicle crash, the resistance values of the resistors 45 change. Because of the Wheatstone bridge configuration, a voltage variation occurs across terminals 46, 47 which is indicative of the movement of the mass 42. Such a transducer or accelerometer is available commercially from ICSensors, 1701 McCarthy Blvd., Milpitas, Calif. 95035 under Model No. 3021.

The bridge resistors 45 are connected to amplifier 40 which provides the output signal 41 having a value indicative of the movement of the mass 42. Specifically, terminal 46 is connected to a non-inverting input 48 of an operational amplifier ("op amp") 49. The output 50 of op amp 49 is connected to its inverting input 51 through feedback resistor 52. Terminal 47 is connected to a non-inverting input 54 of an op amp 56. The output 58 of the op amp 56 is connected to its inverting input 60 through a feedback resistor 62. The inverting input 51 of op amp 49 and the inverting input 60 of op amp 56 are connected together through a variable resistor 64.

The output 50 of the op amp 49 is also connected to the non-inverting input 66 of op amp 68 through a resistor dividing network including resistors 70, 72. A filter capacitor 74 is connected between the junction of resistors 70, 72 and electrical ground. The output 58 of op amp 56 is also connected to the inverting input 76 of op amp 68 through a resistor 78. The output 80 of op amp 68 is connected to the inverting input 76 of the op amp 68 through parallel connected resistor 82 and capacitor 84.

If the resistors 52, 62, 70, 72, 78, and 82 are set equal to a common value, designated R, and if the value of the variable resistor 64 is designated Rvar, the gain "G" of the amplifier 26 is given by:

$$G = (1 + (2R/Rvar))$$

As mentioned above, a deployment crash is one in which it is desirable to deploy the air bag. A non-deployment crash is one in which it is not desirable to deploy the air bag. If an identical type or class of vehicle is subjected to both deployment and non-deployment crashes, different frequency components are present in the output of the accelerometer. Also, if different types of vehicles are subjected to the same type of crash, they can exhibit different frequency components in the accelerometer output signal. For example, if a particular make or model of a vehicle is crashed into a pole at 30 MPH, certain frequency components are present in the accelerometer output signal. If a different make and model vehicle is also crashed into a pole at 30 MPH, completely different frequency components may be present in the accelerometer output signal even though the accelerometers are mounted in equivalent areas in both of the two different types of vehicles. For purpose of clarity, the following discussion addresses frequency components exhibited by only one make and model of vehicle for different types of vehicle crashes.

Figure 5:
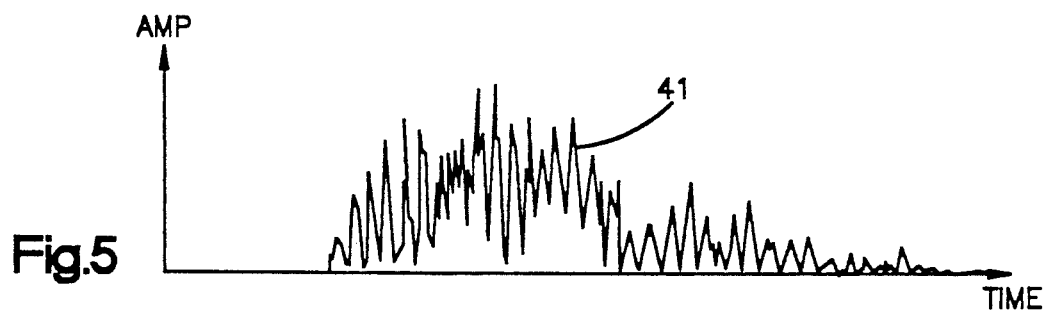
FIG. 5 is a graphical representation of the output of the accelerometer assembly, shown in FIG. 3, during a non-deployment vehicle crash condition.
Figure 6:
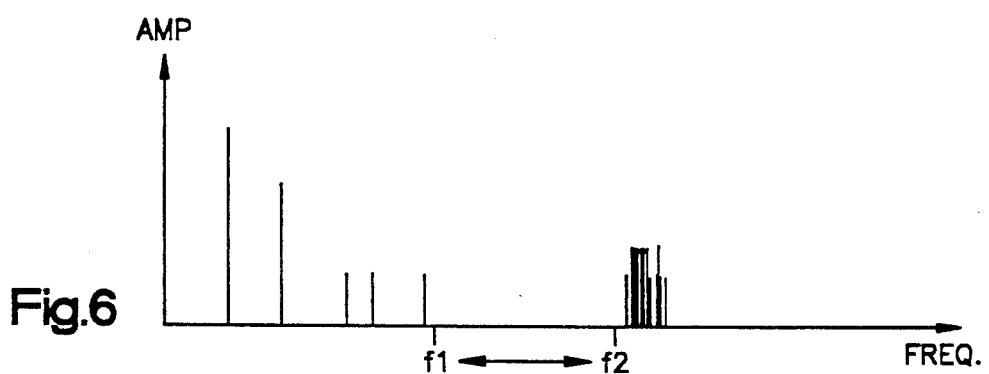
FIG. 6 is a graphical representation of the Fourier transform of the output signal shown in FIG. 5.

Referring to FIG. 5, the output 41 of the crash sensor 18 is graphically depicted during a non-deployment crash condition with amplitude on the y-axis and time on the x-axis. The rough appearance to the graph of the output signal is due to the vibrations of the mass 30 during the vehicle crash. FIG. 6 graphically depicts the Fourier transform of the signal depicted in FIG. 5. Amplitude is on the y-axis and frequency is on the x-axis.

Figure 7:
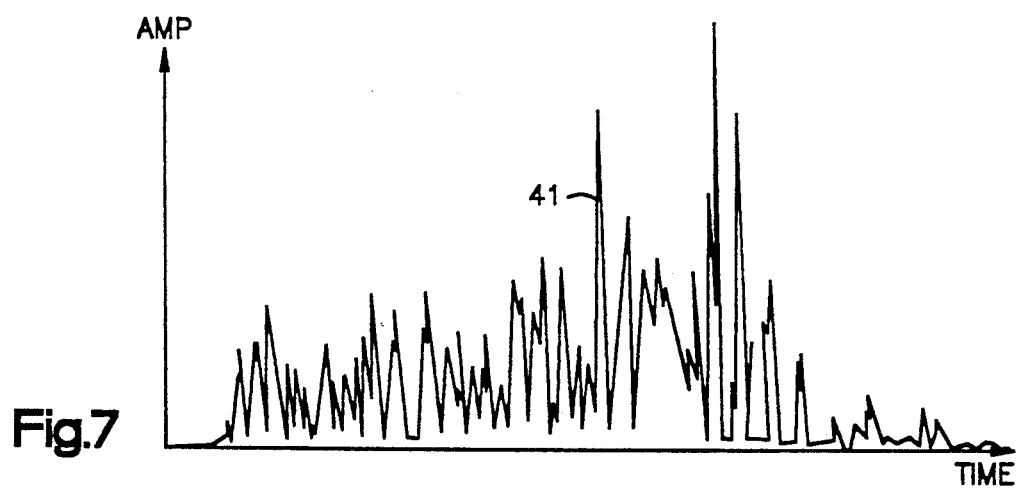
FIG. 7 is a graphical representation of the output of the accelerometer assembly, shown in FIG. 3, when the vehicle is subjected to a deployment crash condition.
Figure 8:
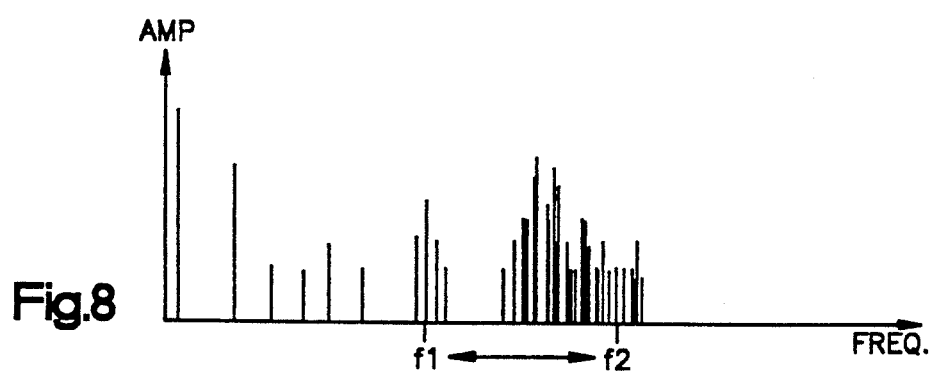
FIG. 8 is a graphical representation of the Fourier transform of the accelerometer output shown in FIG. 7.

Referring to FIG. 7, the output 41 of the crash sensor 18 is graphically depicted during a deployment crash condition with amplitude on the y-axis and time on the x-axis. The rough appearance to the graph of the output signal 41 is due to the vibrations of the mass 42 during the vehicle crash. FIG. 8 graphically depicts the Fourier transform of the signal depicted in FIG. 7. Amplitude is on the y-axis and frequency is on the x-axis.

Comparing the graphs of FIG. 6 and FIG. 8, one can see differences between the frequency components that are present during a non-deployment vehicle crash condition (FIG. 6) and the frequency components that are present during a deployment vehicle crash condition (FIG. 8). In FIG. 6, there are no frequency components of significant magnitude present between frequency f1 and frequency f2. In contrast, frequency components of significant magnitude are present in the frequency band f1 to f2 shown in FIG. 8. Therefore, if one were to monitor the frequency band f1 to f2 over time, and if one were to observe that a change occurred from no significant frequency components being present to significant components being present, such a change would be an indication that a vehicle crash was occurring for which the air bag should be deployed. Alternatively, if one were to monitor the amplitudes of the frequency components within the band f1 to f2 and if the amplitudes of the frequency components matched a predetermined pattern indicative of a deployment crash in that frequency band, such a match of amplitudes would be an indication that a vehicle crash was occurring for which the air bag should be deployed.

Referring back to FIG. 3, the output 41 of the sensor 18 is connected to an anti-alias filter 100 which filters out high frequency components from the signal 41. The frequencies of concern from the output of the sensor 18, i.e., those indicative of a particular type of vehicle crash, are less than 3 KHz.

The output of the anti-alias filter 100 is connected to an A/D converter 102 of a type well known in the art. The A/D converter 102 is connected to a first microcomputer 104 which controls the A/D converter. The control of an A/D converter by a microcomputer is well known in the art and is, therefore, not described herein in detail. Also, microcomputers are referred to in the art as microcontrollers and are commercially available from several manufacturers in a single chip package. Anti-alias filtering prior to feeding a signal to an A/D converter is also known in the art of digital filtering. Such filters are used to eliminate out-of-band signals that can be aliased back into the desired frequency band because of a particular chosen sampling rate.

The output of the A/D converter 102 is connected to a random access memory ("RAM") 106. The microcomputer 104 is also connected to the RAM 106 and controls the locations within the RAM 106 where the data from the A/D converter is stored. This is accomplished by the microcomputer addressing locations of the RAM 106 as the data is output from the A/D converter 102.

The RAM 106 is divided into four groups of 128 data sets, each data set being indicative of the analog value of the sensor signal 41 present at its associated sampled time. The output of the RAM 106 is connected to a digital transform processor 110. The digital transform processor 110 provides an output signal that represents the transform of the time domain output signal 41 of the sensor 18 into a frequency domain signal.

The digital transform processor 110 can take one of several forms such as a fast Fourier transform device, a cosine transform device, etc. One contemplated digital transform processor that can be used is a fast Fourier transformer that is manufactured by TRW LSI Products Inc., of La Jolla, Calif. under part No. TMC2310.

The digital transform processor 110 is connected to a second microcomputer 120 that controls the processor 110. The second microcomputer 120 is also connected to the first microcomputer 104. The output of the digital transform processor 110 is connected to a transform memory 124. The memory 124 is an addressable memory and is connected to and controlled by the second microcomputer 120. After the digital transform processor 110 completes a transform, the resultant transform is stored in an addressable location within the memory 124.

The output of the transform memory 124 is connected to a correlator 130. The correlator 130 is connected to and controlled by the second microcomputer 120. The correlator 130 provides an output signal having a value indicative of a degree of correlation between two sets of data. One of several types of correlation techniques can be used to provide control of a vehicle passenger restraint system. For example, a present data transform data set can be compared against another data set that was sampled just prior in time. Alternatively, a present data set can be compared against a predetermined data set that is stored in memory. In another alternative, the amplitudes of a present data set forms a pattern which can be compared against a predetermined pattern stored in memory.

Correlation of data streams over time is well known in the art. Generally, correlation is a comparison process. As is discussed in a paper by John Eldon entitled "Correlation ... A Powerful Technique For Digital Processing" copyrighted 1981 by TRW Inc., the comparison done in the correlation between two functions v1(t) and v2(t) can be mathematically expressed as:

$$R(\tau) = \lim T \to \infty \int_{-\frac{T}{2}}^{+\frac{T}{2}} v1(t) \times v2(t + \tau) dt$$

where R refers to the correlation between two signals v1 and v2, $\tau$ is the time delay, and T is the period of the functions v1 and v2. The Eldon article states that the correlation "is determined by multiplying one signal, v1l(t), by the other signal shifted in time, v2(t+$\tau$), and then taking the integral of the product. Thus, correlation involves multiplication, time shifting (or delay) and integration."

When correlating data in the frequency domain, one compares the amplitude values for specific frequency components within a predetermined spectrum either against themselves after a time delay, against predetermined values for those specific frequency components, or against a predetermined pattern of amplitude values for the predetermined spectrum. Correlation of data is well known in the arts of radar and sonar systems. Also, correlators are commercially available items available to designers in the art. One specific correlator that can be used is manufactured by TRW LSI Products Inc., of La Jolla, Calif., under part No. TDC1023J, "Digital Output Correlator." The above-mentioned Eldon article discusses the principles of correlation and several correlation techniques.

The output of the correlator 130 is connected to an addressable correlator memory 136, which stores the correlation results from the correlator 130. The memory 136 is connected to and controlled by the second microcomputer 120.

The correlator 130 correlates the frequency domain data stored in the memory 124 against a predetermined frequency domain data pattern stored in an internal memory 132 of the correlator 130. In such an arrangement, the correlator 130 compares the amplitude values of frequency components in predetermined discrete frequency bands against stored amplitude values for the same frequency components in the same frequency bands. The correlator 130 provides an output signal to the second microcomputer 120 indicative of the degree or percentage of data correlation. Dependent upon the degree of correlation present at specific frequency component values, the second microcomputer 120 makes a determination on whether or not to actuate the passenger restraint system.

Alternatively, the correlator correlates a stream of frequency domain data from memory 124 against a second stream of frequency domain data from memory 124 that is sampled a predetermined time after the first data stream. In such an arrangement, the correlator compares the amplitudes of frequency components in selected frequency bands against the amplitudes of the same frequency components in the same frequency bands a predetermined time delay later. A change in amplitude of apredetermined amount or a lack of amplitude change for a particular frequency component over time indicates a type of vehicle crash occurring. The correlator provides an output signal to the second microcomputer 120 indicative of the degree of correlation for the frequency components of concern. Dependent upon the correlation signal received from the correlator, i.e., the degree of correlation, the second microcomputer makes a determination on whether or not to actuate the passenger restraint system.

Alternatively, the correlator correlates a change in a pattern of the frequency domain data against a change in such a pattern stored in memory 132. In such an arrangement, changes in amplitude of frequency components, as compared against themselves a predetermined time period later within a predetermined frequency band define a pattern of amplitude changes. The correlator compares the changes in frequency component amplitude patterns within a predetermined frequency band against predetermined amplitude change patterns stored in memory. The correlator provides an output signal to the second microcomputer 120 indicative of the degree of correlation. Dependent upon the correlation signal, the second microcomputer 120 makes a determination on whether or not to actuate the passenger restraint system. In effect, the microcomputer 120 makes the determination on whether or not to actuate the passenger restraint system based upon the degree of correlation from the correlator 130.

The microcomputer 120 is connected to one input of the AND gate 21. As described above, the diagnostic controller 24 is connected to the second input of the AND gate 21. The output of AND gate 21 is connected to a one-shot 140. When the microcomputer 120 determines from the correlated data that the vehicle is in a deployment crash, it outputs a trigger signal to the AND gate 21. If the AND gate 21 is enabled by a digital HIGH from the diagnostic controller 24, the trigger signal is inputted to the one-shot 140. The output of the one-shot 140 is connected to an electronic, normally open switch 142, such as a field effect transistor ("FET"). The switch 142 is connected in series with a squib 144 between a source of electrical energy V and electrical ground. Upon being triggered, the one-shot outputs a pulse that closes the switch 142 for a time duration sufficient to insure that the squib is ignited.

Figure 9:
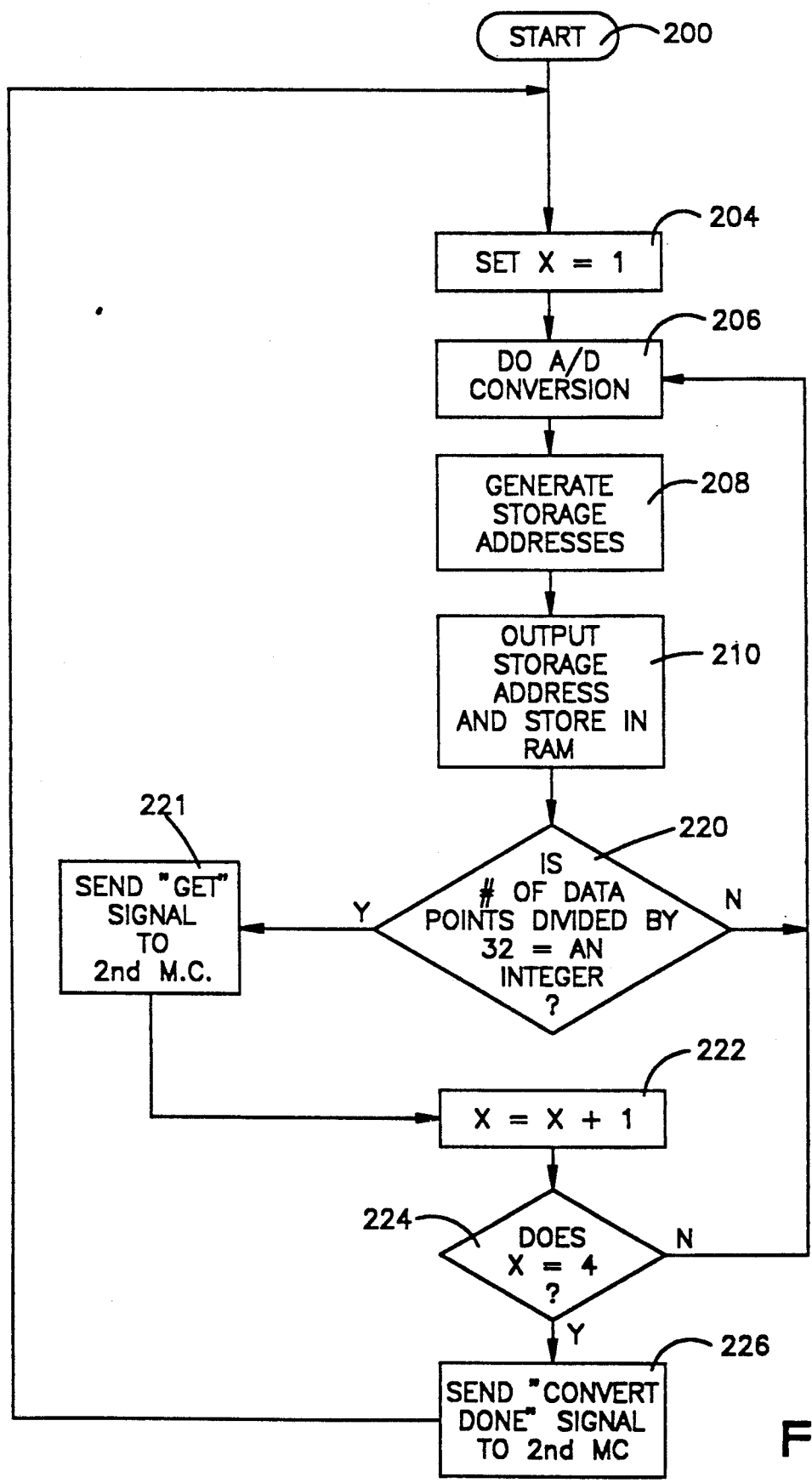
FIG. 9 is a flow chart depicting the control process for one microcomputer shown in FIG. 3.

Referring to FIG. 9, the data conversion control of the A/D converter will be better understood. The control starts at step 200. In step 204, the microcomputer 104 sets a value X equal to one. In step 206, the microcomputer 104 enables the A/D converter 102 to begin conversion. The microcomputer 104 then generates addressable storage locations for the RAM 106 in step 208. In step 210, the converted signals from the A/D converter 102 are stored in the RAM 106. As mentioned above, the converted values are stored in four groups with 128 sets of data points in each group.

In step 220, a determination is made as to whether or not the number of data point sets converted and stored divided by 32 is equal to an integer. Since the total data sets per group is 128, dividing by 32 will give a 75% overlap for data analysis. If the determination is negative, the control loops back to step 206 where further conversions are done. If the determination in step 220 is affirmative, the control proceeds to step 221 where the first microcomputer 104 sends a "get" signal to the second microcomputer 120. The program then proceeds to step 222 where X is set equal to X+1. In step 224, the microcomputer 104 makes a determination as to whether the value of X is equal to 4. If the determination in step 224 is negative, the control arrangement proceeds back to step 206. If the determination in step 224 is affirmative, the control arrangement proceeds to step 226. In step 226, the microcomputer 104 sends a "convert done" signal to the second microcomputer 120.

Figure 10:
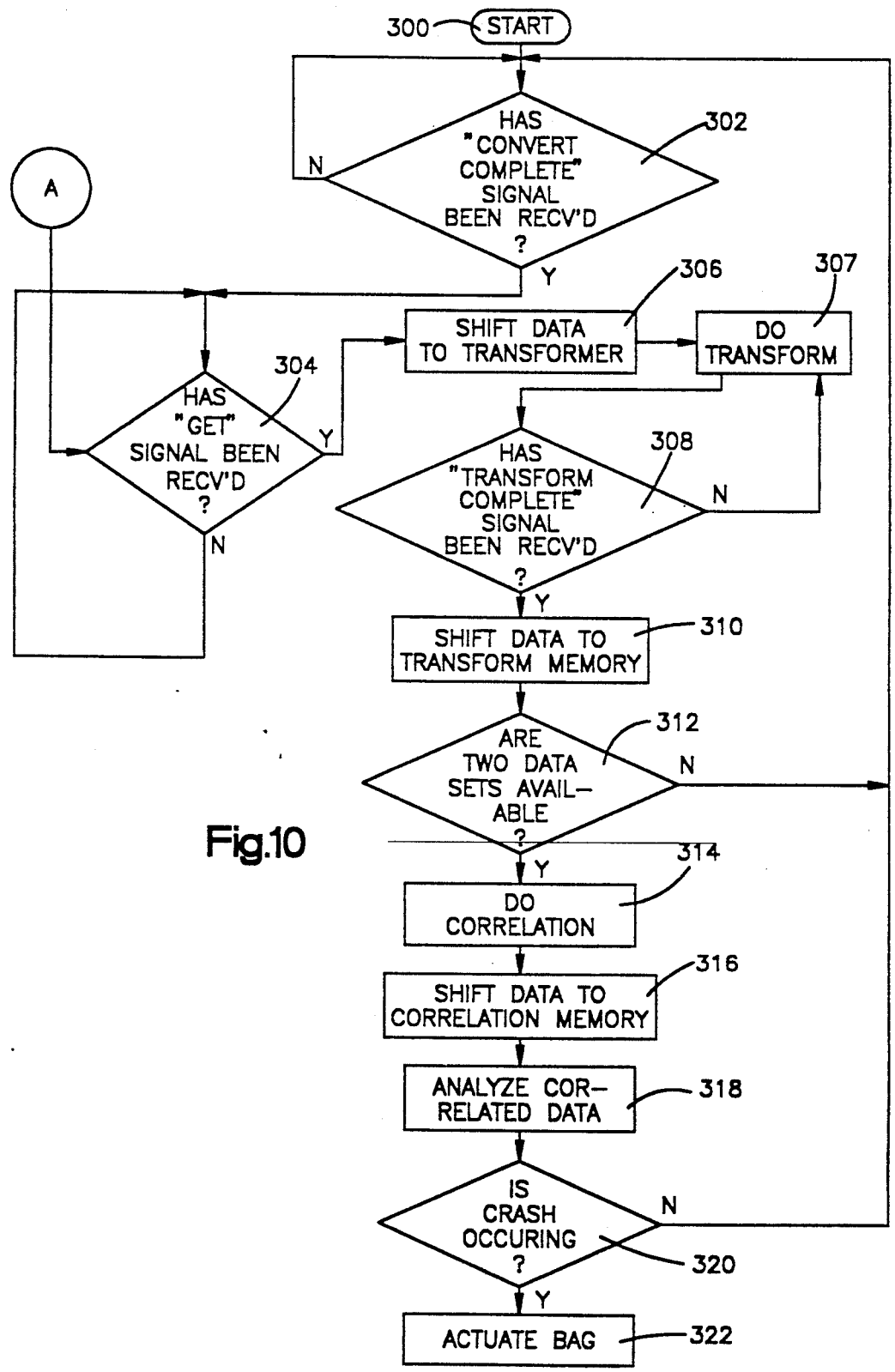
FIG. 10 is a flow chart depicting the control process for the other microcomputer shown in FIG. 3.

FIG. 10 shows the control procedure followed by the second microcomputer 120 for transforming the A/D converter data into the frequency domain. The procedure starts in step 300. A determination is made in step 302 as to whether the convert complete or done signal has been received from the A/D converter. If the determination is negative, the control procedure loops back upon itself. If the determination in step 302 is affirmative, which indicates that 128 data points are ready for transformation into the frequency domain, the program proceeds to step 304 in which a determination is made as to whether the "get" signal has been received.

The microcomputer 120 will receive a "get" signal from the microcomputer 104 each time 32 data points are converted by the A/D converter and stored in the memory 106. However, the control arrangement will not get to step 304 until 128 sets of data points are initially received and stored. If the determination in step 304 is negative, the control process loops back upon itself. If the determination in step 304 is affirmative, the process proceeds to step 306 where 128 data sets are shifted out of the memory 106 into the digital transform processor or transformer 110. In step 307, the data transform is conducted so as to change the time domain signal into a frequency domain signal. After the transform is completed, the transformer outputs a "transform complete" signal to the microcomputer 120.

The effect of step 302 and 304 is that the second microcomputer 120 does not permit any transforms in step 307 until 128 data points are available (step 302). After 128 data points are available, a transform is performed every time 32 new data points become available.

In step 308, a determination is made as to whether the microcomputer 120 has received the transform complete signal from the transformer 110. If the determination is negative, the control loops back to step 307. If the determination is step 308 is affirmative, the process proceeds to step 310 where the transformed data is stored in the transform memory 124.

In step 312, a determination is made as to whether there are two data sets ready for correlation by the correlator 130. If the determination in step 312 is negative, the control process loops back to step 302. If the determination in step 312 is affirmative, the control process proceeds to step 314 where correlator 130 does the correlation of data.

Two real time sets of frequency domain data to be used for correlation are both stored in the memory 124, the two frequency domain data sets both being derived from real time transformations separated by a predetermined time delay. For example, in step 304, the microcomputer 120 will shift data to the transformer every time 32 A/D conversions are stored in the RAM 106. Therefore, although the RAM 106 stores data in groups of 128, the transformer 110 does a data transform of a set of 128 data points every time 32 conversions from the A/D converter are completed. This arrangement provides a 75% overlap of data. The correlator will then be correlating the frequency domain values of the accelerometer signal with corresponding values after a time delay equal to the time necessary to do 32 conversions from the A/D converter.

Alternatively, one set of data for use by the correlator is stored in the memory 124. A second set of data is stored in the memory 132. The second set of data stored in the memory 132 is a predetermined pattern of frequency domain amplitude values that are indicative of a vehicle deployment crash.

Alternatively, a stream of data for use by the correlator is continuously stored in the memory 124. The correlator determines pattern changes occurring at specific frequency values for the real time data being stored in memory 124. Pattern changes for specific frequency values which are indicative of a particular type of vehicle crash are stored in the memory 132. The correlator compares the real time pattern changes from the data stored in memory 124 against the pattern changes stored in its memory 132.

The results of the correlations done by the correlator 130 are stored in the memory 136 in step 316. The microcomputer 120 analyzes the correlation results stored in memory 136 in step 318. In step 320, the microcomputer 120 makes a determination, based upon the correlation results, as to whether the vehicle is in a crash condition for which it is desirable to actuate the passenger restraint system. A specific correlation process is discussed below with regard to FIGS. 12 and 13, including how the microcomputer 120 makes its determination based on the correlation results from the correlator 130. If the determination in step 320 is negative, the control process loops back to step 302. If the determination in step 320 is affirmative, the microcomputer 120 outputs the actuation signal to the AND gate 21 in step 322 which, when the AND gate 21 is enabled, initiates actuation of the passenger restraint system.

Figure 11:
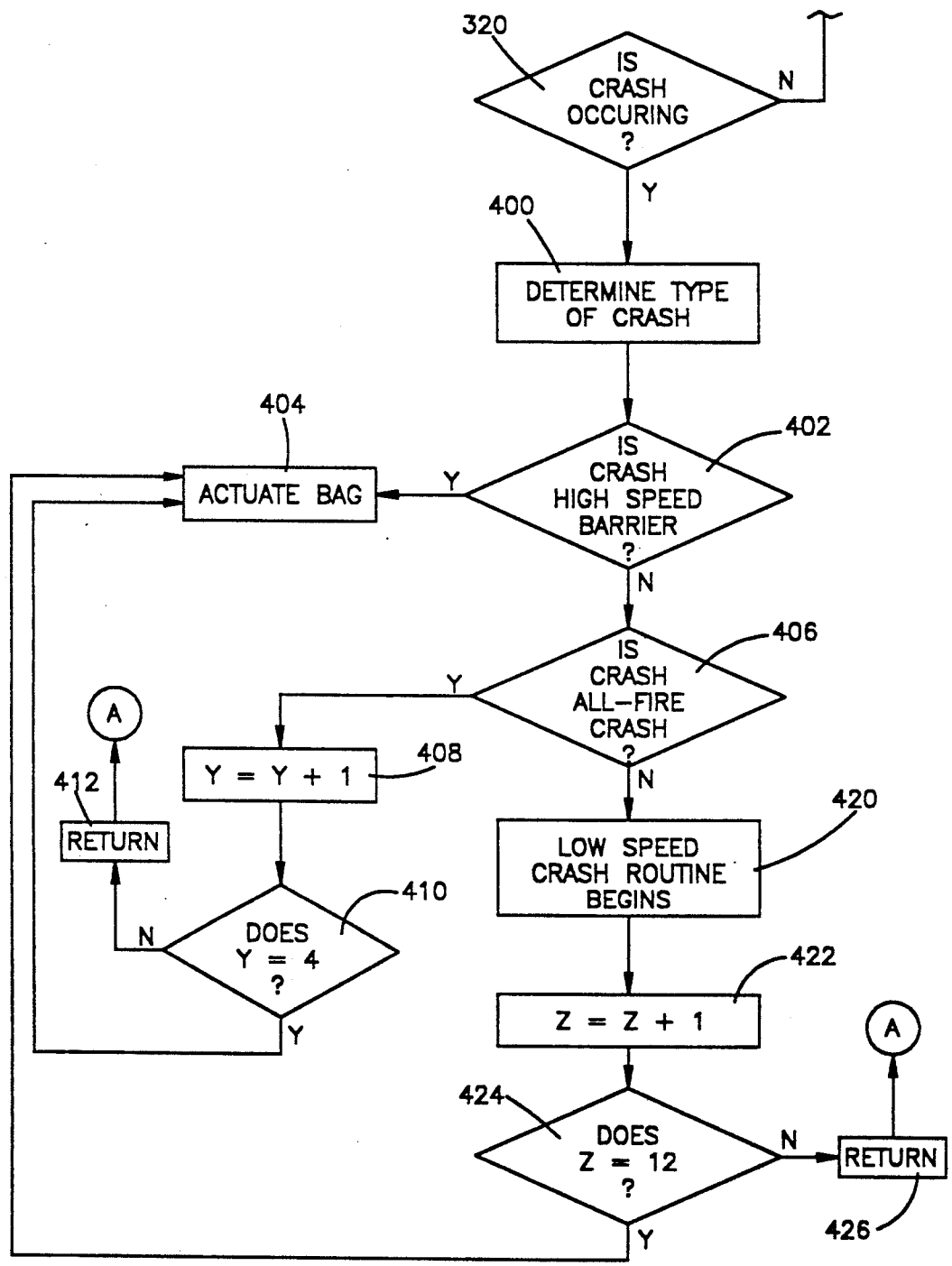
FIG. 11 is a partial flow chart depicting an alternative control process for the other microcomputer shown in FIG. 3.

FIG. 11 depicts an alternative control arrangement followed by the microcomputer 120. All control steps up to step 320 are as described with regard to FIG. 10. In step 320, a determination is made as to whether a crash is occurring for which it is desirable to actuate the air bag. The determination in step 320 will be affirmative if the crash is greater than a "no-fire" barrier condition, e.g., greater than an eight mile per hour barrier crash. This determination is made by the microcomputer 120 in response to the detected correlation and empirically determined correlations for known crashes. If the determination in step 320 is affirmative, the microcomputer 120, based upon the correlation results, determines the specific type of vehicle crash in step 400. To make determinations of the specific type of vehicle crash based upon correlation results, one must use an empirical technique. For example, a type of vehicle of concern must be subjected to several types of vehicle crashes. For each type of vehicle crash, the correlation results must be recorded and stored in memory in the microcomputer 120. To make the determination of the type of crash in real time, the microcomputer 120 compares the correlation results against its stored correlation results.

For the determination of the type of vehicle crash, the microcomputer 120, in step 402, determines if the crash is a high speed barrier crash. To make the determination of a high speed barrier crash, the microcomputer compares the type of correlation indicative of a high speed barrier crash from its memory against the correlation results stored in the memory 136. If the determination in step 402 is affirmative and if the AND gate 21 is enabled, the air bag is immediately actuated in step 404.

If the determination in step 402 is negative, the microcomputer 120 makes a determination in step 406 as to whether the correlation is indicative of an "all-fire" crash condition, e.g., a low speed barrier crash greater than 8 MPH, a high speed pole crash, a high speed angle crash, or a high speed car to car crash. If the determination in step 406 is affirmative, a value Y, which is initially set equal to zero, is updated to equal Y+1. In step 410, a determination in step 410 is negative, the equal to 4. This occurs after four passes through step 408. If the determination in step 410 is negative, the control procedure is returned in step 412 to step 304 of FIG. 10 through line A. If the determination in step 410 is affirmative, the microcomputer 120 outputs the trigger signal to the AND gate 21.

It will be appreciated that the steps 408 and 410 provide a time delay of four system cycles. This time delay is desirable since the type crash, i.e., one other than a high speed barrier crash, does not require immediate actuation of the air bag. Also, during the time delay of four systems cycles, the correlations are continuously monitored. If the type of vehicle crash does not change, the determination in step 410 will be affirmative after the fourth system cycle. If during the process of continuously monitoring the correlation data the type of crash changes, the control of the actuation will also change. For example, if the control arrangement were to change from an all-fire crash condition as sensed in step 406 to a high speed barrier crash as determined in step 402, the determination is step 402 would change to an affirmative which would result in immediate outputting of the actuation signal. Also, if an all-fire crash condition as sensed in step 406 were to discontinue, as might occur if a small pole were hit and such pole were to break free from the ground, the determination in step 320 would change from affirmative to negative, thereby preventing the air bag from needlessly being actuated.

If the determination in step 406 is negative, it is assumed that the type of vehicle crash is a low speed crash, indicated by block 420, of such magnitude that it is desirable to energize the air bag at a predetermined time delay after the crash is first sensed. Such low speed crashes are, for example, low speed pole crashes or low speed angle crashes. When the determination in step 406 is negative, a value Z is set equal to zero. In step 422, the value of Z is updated to equal Z+1. In step 424, a determination is made as to whether Z equals 12. This occurs when step 422 is passed through twelve times. Step 424 provides that twelve system cycles are required with the crash condition remaining in the low speed crash condition before the determination in step 424 would be affirmative. This time delay is desirable since it is not necessary to actuate the air bag immediately to protect the vehicle passenger. During the 12 system cycles, data processing continues. If the type of vehicle crash changes within the 12 systems cycles, the control of the process would also change accordingly. If the determination in step 424 is affirmative, meaning that the low speed crash condition has lasted for 12 systems cycles, the air bag is then actuated. If the determination in step 424 is negative, the control process returns in step 426 to step 304. Also, if the low speed crash condition were to discontinue, the determination in step 320 would change from affirmative to negative, thereby preventing the air bag from needlessly being actuated.

Figure 12:
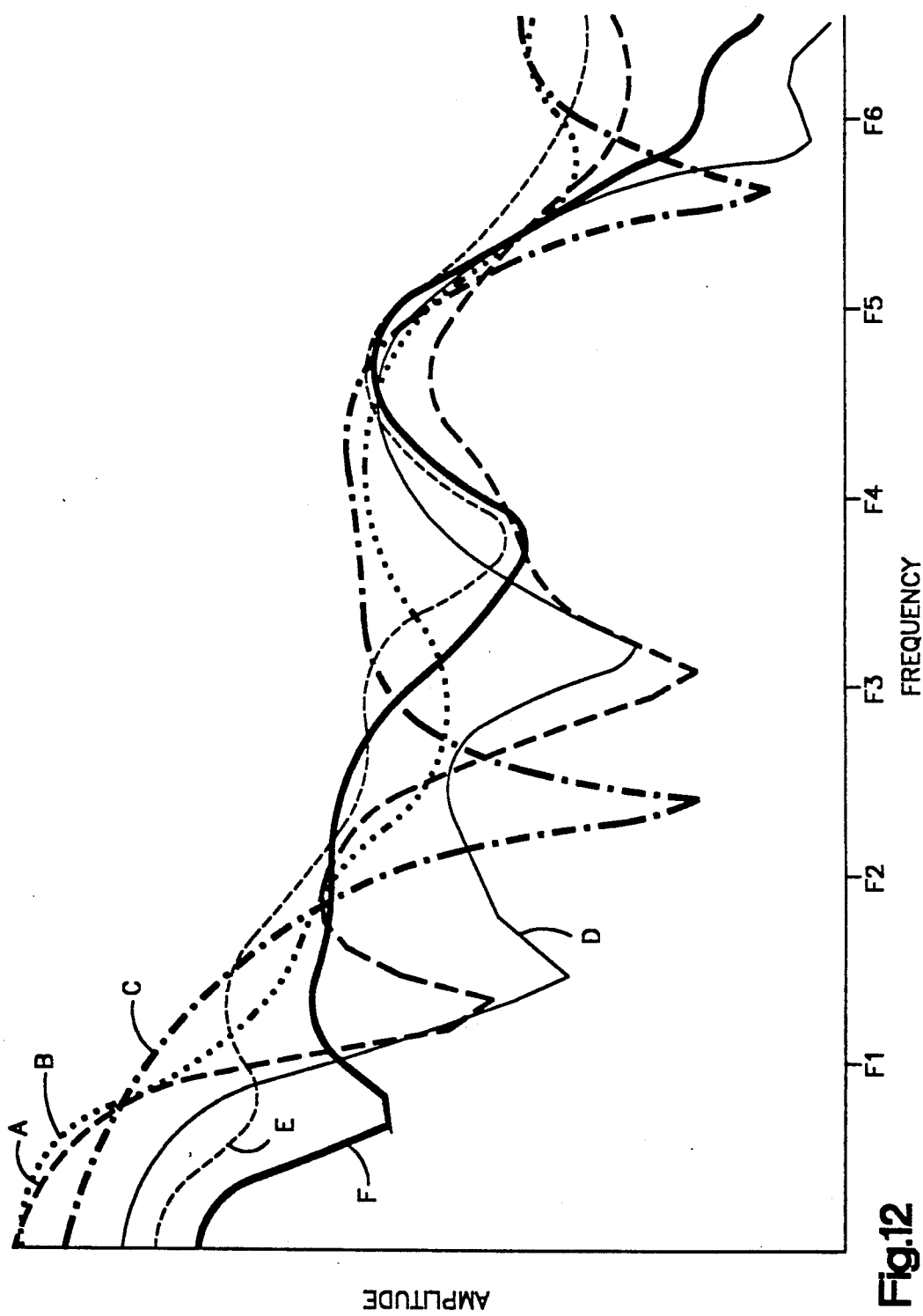
FIG. 12 is a graphical representation of a signal processed in a correlator shown in FIG. 3 for a non-deployment vehicle crash.
Figure 13:
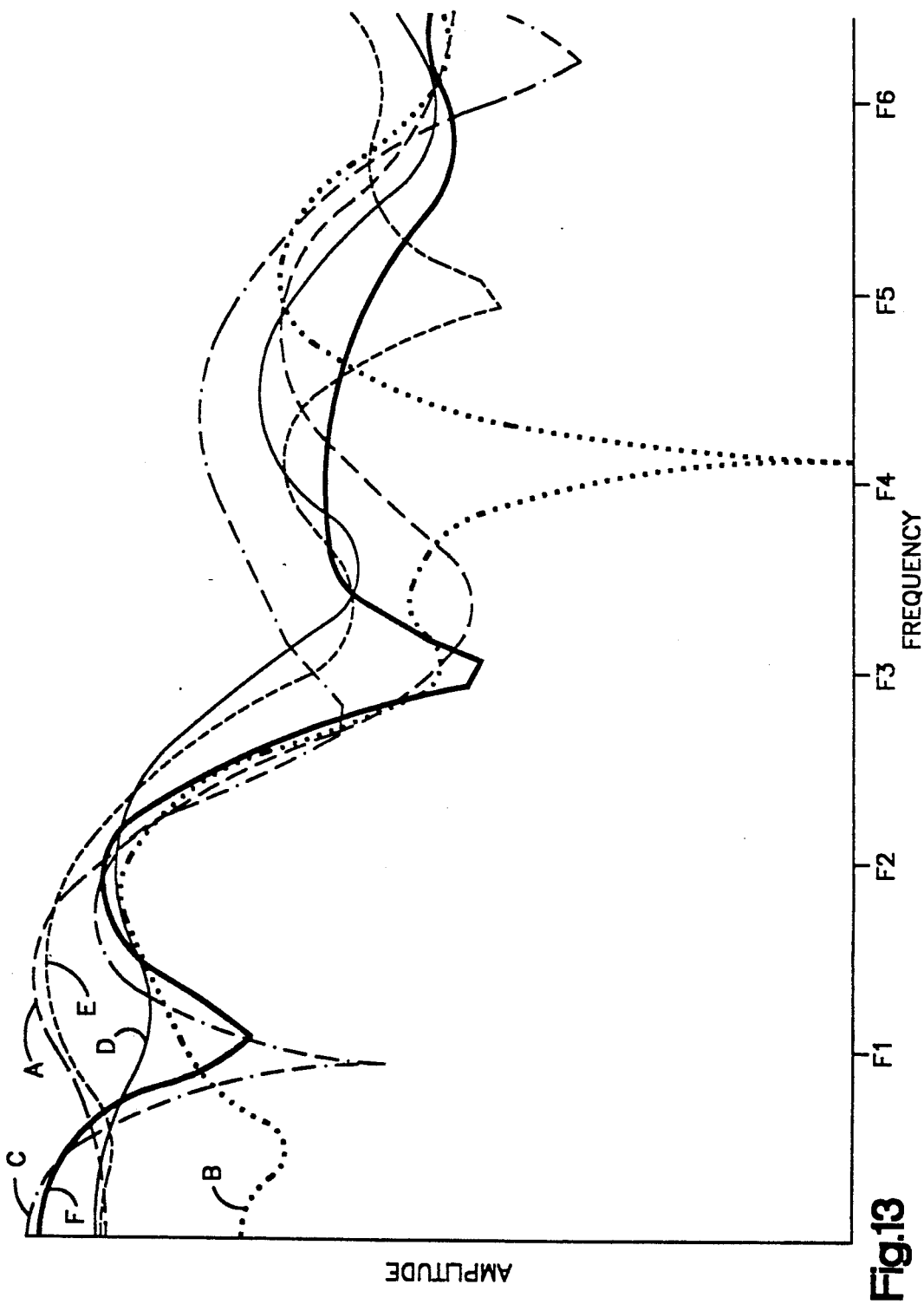
FIG. 13 is a graphical representation of a signal processed in the correlator shown in FIG. 3 for a deployment vehicle crash.

FIGS. 12 and 13 depict the transform output from the transformer 110 graphed over a finite frequency spectrum with frequency on the X-axis and amplitude on the Y-axis. FIG. 12 represents a transform output for a no-fire barrier crash condition of the type in which it is not desirable to actuate the air bag, i.e., a non-deployment condition. FIG. 13 represents a transform output for a pole crash for which it is desirable to actuate the air bag, i.e., a deployment condition. Each of the graph lines represents the transform output that is delayed by a predetermined amount. Each graph of FIGS. 12 and 13 has six graph lines designated A through F. Each graph line is a graph of the spectrum frequency amplitudes present at its sampling time. Graph line A occurred first in time followed by graph line B, etc. The time delay between graph lines is the time needed to convert 32 data points in the A/D converter. A high degree of correlation between time delayed samplings of data at a particular frequency component value is indicative of a particular vehicle condition, e.g., soft crash, hard crash, or no crash. A low degree of correlation between time delayed samplings of data at another particular frequency component value is indicative of another particular vehicle condition, e.g., soft crash, hard crash, or no crash.

Through empirical methods of subjecting a particular vehicle type to various types of crash conditions, time delay correlation values, correlation patterns, and changes in correlation patterns for both deployment and non-deployment conditions can be monitored and recorded. The empirically determined correlation values are used by the microcomputer 120 to make the determinations as to the present condition of the vehicle.

FIGS. 12 and 13 depict the frequency domain graphs for a non-deployment crash condition and a deployment crash condition, respectively. Along the X-axis, six frequency component values, F1, F2, F3, F4, F5, and F6, are shown. They represent six frequency component values that are used to determine whether the vehicle is in a deployment or non-deployment condition. The data shown in the graphs of FIGS. 12 and 13 is that inputted to the correlator 130. The correlator is correlating data with itself after a time delay. The correlator will output a signal having a value indicative of the degree of correlation for each of the frequency component values F1, F2, F3, F4, F5, and F6 for each of the graph lines A through F. The microcomputer 120 compares the correlation results against predetermined correlation results stored in its internal memory. Based upon the results of the correlation, the microcomputer will make a determination as to whether to actuate the passenger restraint system.

At frequency F1, the degree of correlation between lines A, B, and C in FIG. 12 is relatively high as compared to the degree of correlation between those same lines in FIG. 13. If the correlator were to output a high degree of correlation for frequency F1, such a condition would be indicative of a non-deployment condition. If the correlator were to output a low degree of correlation for frequency F1, such a condition would be indicative of a deployment condition.

At frequency F2, the degree of correlation between lines D and E in FIG. 12 is relatively low as compared to the degree of correlation between those same lines in FIG. 13. If the correlator were to output a high degree of correlation for frequency F2, such a condition would be indicative of a deployment condition. If the correlator were to output a low degree of correlation for frequency F2, such a condition would be indicative of a non-deployment condition.

At frequency F3, the degree of correlation between lines C and D in FIG. 12 is relatively low as compared to the degree of correlation between those same lines in FIG. 13. If the correlator were to output a high degree of correlation for frequency F3, such a condition would be indicative of a deployment condition. If the correlator were to output a low degree of correlation for frequency F3, such a condition would be indicative of a non-deployment condition.

At frequency F4, the degree of correlation between lines B and C in FIG. 12 is relatively high as compared to the degree of correlation between those same lines in FIG. 13. If the correlator were to output an extremely low degree of correlation for frequency F4, such a condition would be indicative of a deployment condition. If the correlator were to output an high degree of correlation for frequency F4, such a condition would be indicative of a non-deployment condition.

At frequency F5, the degree of correlation between lines D and E in FIG. 12 is relatively high as compared to the degree of correlation between those same lines in FIG. 13. If the correlator were to output a high degree of correlation for frequency F5, such a condition would be indicative of a non-deployment condition. If the correlator were to output a low degree of correlation for frequency F5, such a condition would be indicative of a deployment condition.

At frequency F6, the degree of correlation between lines D and E in FIG. 12 is relatively low as compared to the degree of correlation between those same lines in FIG. 13. If the correlator were to output a high degree of correlation for frequency F6, such a condition would be indicative of a deployment condition. If the correlator were to output a low degree of correlation for frequency F6, such a condition would be indicative of a non-deployment condition.

The microcomputer 120 monitors the correlation results and compares the results against predetermined correlation results stored in its internal memory. Based on the results, the microcomputer 120 controls the outputting of a signal which, in turn, results in actuation of the passenger restraint system when AND gate 21 is enabled.

This arrangement further functions to filter out certain occurrences for which it is not desirable to actuate the air bag. For example, if the vehicle was subject to a high frequency hammer blow, those frequencies would be filtered out by the anti-alias filter.

With the arrangement described with regard to FIGS. 3-13, the crash signals stored in memory 25 are a plurality of groups of digitized signals, each group of signals representing an associated crash condition for that vehicle. The processing circuit 20 processes the input signals independently regardless of their source, i.e., from the memory 25 or from the A/D converter 102. The stored groups of signals in the memory 25 simulate the signals from the A/D converter 102 for the various types of crash conditions. The controller 24 monitors the output from the microcomputer 120 for the appropriate response as described above with regard to FIG. 2.

Figure 14:
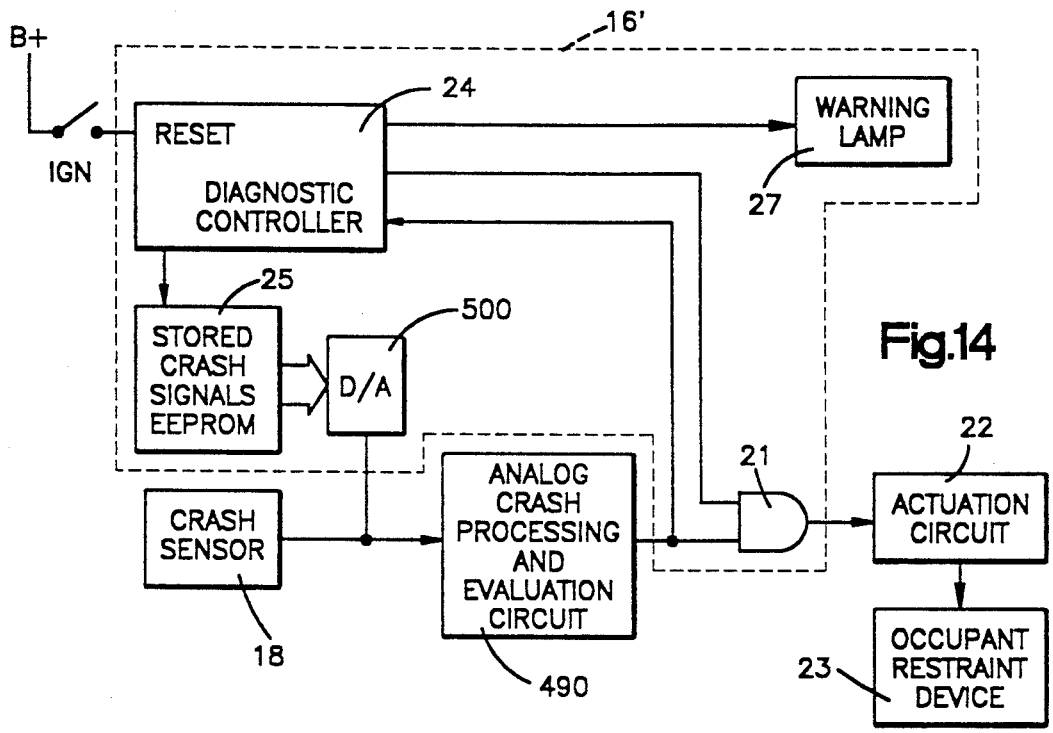
FIG. 14 is a schematic block diagram showing a diagnostic test circuit made in accordance with the present invention for an occupant restraint system having an analog crash algorithm processing circuit; and, FIG. 15 is a schematic block diagram of a portion of the passenger restraint control system of FIG. 14 showing the analog crash algorithm processing circuit in more detail.

Referring to FIG. 14, an arrangement similar to that shown in FIG. 1 is depicted. The major difference from the FIG. 1 arrangement is that, in FIG. 14, the signal from the crash sensor 18 is processed by an analog crash processing circuitry 490. The crash signals stored in the memory are converted to an analog signal through a D/A converter 500 of a type well known in the art. The output of the D/A converter 500 is connected to the input of the analog crash circuitry 490. The output of the crash sensor 18 is connected directly to the input of processing circuit 490. It should be understood by those skilled in the art that the output of the sensor 18 and the output of the D/A converter 500 are essentially ORed together by appropriate analog circuitry not shown here. The output of processing circuit 490 is a digital signal generated by an analog switching circuit so as to output a digital HIGH when the occupant restraint device is to be actuated and a digital LOW when no actuation is to occur. The control arrangement for FIG. 14 is the same as shown in FIG. 2.

Figure 15:
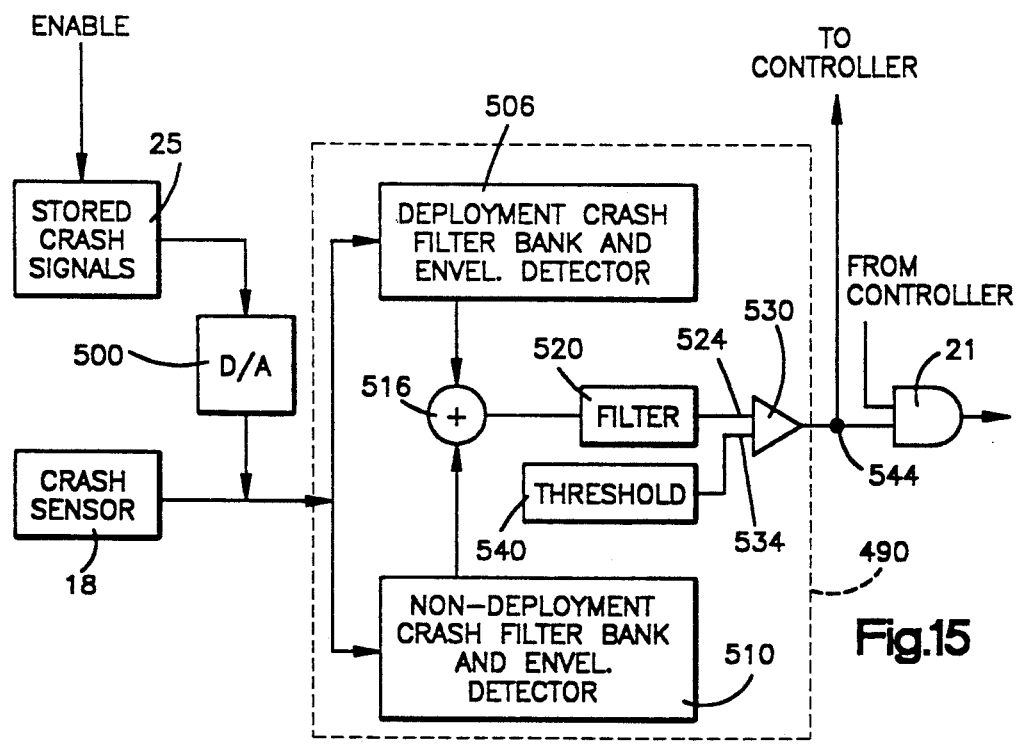

FIG. 15 depicts one specific arrangement of an analog crash processing circuit 490. The circuit 490 includes a deployment crash filter bank and envelope detector 506. The circuit 490 further includes a non-deployment crash filter bank and envelope detector 510. The outputs of the filter banks and envelope detectors 506 and 510 are summed in a summing circuit 516. The output of the summing circuit 516 is connected to a filter circuit 520 which is, in turn, connected to one input 524 of a comparator 530. The second input 534 of the comparator 530 is connected to a threshold circuit 540. The output 544 of the comparator 330 is connected to the diagnostic controller 24 and to one input of the AND gate 21. An output of the controller 24 is connected to the other input of the AND gate 21 in the same manner as described above.

The presence of certain frequency components in the output signal of the crash sensor 18 indicates that the vehicle is in a deployment crash condition. Similarly, the presence of certain other frequency components in the output signal of the crash sensor 18 indicates that the vehicle is not in a crash condition. The frequency components that are indicative of either the vehicle being in deployment or a non-deployment crash condition are determined through empiricle methods. Certain of the groups of signals stored in the memory 25 include frequency components indicative of a deployment crash condition. Other groups of signals stored in the memory 25 do not include frequency components indicative of a deployment crash condition and may include frequency components which are indicative of a non-deployment crash condition.

When the input signal to the analog crash processing circuit 490, whether from the sensor 18 or from the memory 25 through the A/D converter 500, includes frequency components indicative of a deployment crash condition and none which are indicative of a non-deployment crash condition, the value of the filtered output of the summing circuit 516 will exceed the value of the threshold 540. When the value of the filtered output of the summation circuit 510 exceeds the value of the threshold 540, the comparator 530 outputs a digital HIGH. When the input to the processing circuit 490 includes frequency components indicative of a non-deployment crash condition and none which are indicative of a deployment crash condition, the value of the filtered output from the summing circuit 516 is less than the value of the threshold 540. This occurrence results in a digital LOW being output from the comparator 530.

The controller 24 tests the analog crash processing circuit 490 upon vehicle start-up by outputting a digital LOW to AND gate 21, recalling crash signals from memory 25, and monitoring the output 544 for correct responses in the exact manner as described above with regard to FIG. 2. If an incorrect response is monitored, the warning indicator 27 is actuated. If all response to the applied crash signals are correct, the AND gate 21 is enabled by the controller 24 outputting a digital HIGH to the AND gate 21.

From the above description of a preferred embodiment of the invention, those skilled in the art will perceive improvements, changes and modifications. Such improvements, changes and modifications within the skill of the art are intended to be covered by the appended claims.

Having described a preferred embodiment of the invention, the following is claimed:

1. An apparatus for testing an actuatable occupant restraint system for a vehicle, said system being of a type having an actuatable occupant restraint device, a crash sensor for, when subjected to any of a plurality of specific types of vehicle crash conditions, providing a signal having an identifiable electrical characteristic indicative of one of said specific types of vehicle crash conditions, and a processing circuit having an output providing an actuation signal to the occupant restraint device when the crash sensor signal indicates an occurrence of a predetermined specific type of vehicle crash condition, said apparatus comprising:

means for storing a plurality of simulated crash sensor signals, each stored simulated crash sensor signal being indicative of an associated predetermined specific type of vehicle crash condition;

means for disabling electrical communication between an output of said processing circuit and the actuatable occupant restraint device;

means for applying said stored simulated crash sensor signals from said means for storing to an input of said processing circuit;

means for monitoring the output of the processing circuit when any of said stored simulated crash sensor signals is applied to the processing circuit;

means for determining if the monitored signal output from the processing circuit correctly responds to the associated, applied simulated crash sensor signal and for outputting a signal when the response is not correct; and means for providing a warning indication if said output signal from said means for determining indicates that the processing circuit has not properly responded to any of said applied simulated crash sensor signals.

2. The apparatus of claim 1 wherein said means for disabling includes a logic AND gate, said means for monitoring being connected to one input of said AND gate and said output from said processing circuit being connected to another input of said AND gate, the output of said processing circuit providing a digital signal indicative of the vehicle crash condition.

3. The apparatus of claim 1 wherein the processing circuit is a digital processing circuit.

4. The apparatus of claim 1 wherein the processing circuit is an analog processing circuit.

5. An actuatable occupant restraint system having an actuatable occupant restraint device, said system comprising:

a crash sensor for, when subjected to any of a plurality of specific types of vehicle crash conditions, providing a signal having an identifiable electrical characteristic indicative of one of said specific types of vehicle crash conditions;

a processing circuit connected to said crash sensor and having an output for providing an actuation signal t the occupant restraint device when said crash sensor signal indicates an occurrence of a predetermined specific type of vehicle crash condition;

memory means connected to said processing circuit for storing a plurality of simulated crash sensor signals, each stored simulated crash sensor signal being indicative of an associated, predetermined specific type of vehicle crash condition;

disabling means connected to the output of said processing circuit for disabling electrical communication between the output of the processing circuit and the actuatable restraint device;

control means connected to said memory means, said disabling means, and said output of said processing circuit for controlling the disabling of electrical communication between the output from said processing circuit and the actuatable restraint device, for applying any of said stored simulated crash sensor signals from said memory means to said processing circuit, for monitoring the output of said processing circuit when any of said stored simulated crash sensor signals is applied to said processing circuit, and for determining if the output signal from said processing circuit correctly responds to any of said applied stored simulated crash sensor signals; and a warning indicator connected to said control means, said control means actuating said warning indicator when said control means determines the processing circuit has not properly responded to any of said applied stored simulated crash sensor signals from said memory means.

6. A test circuit for an actuatable occupant restraint system having an actuatable occupant restraint device, a crash sensor for, when subjected to any of a plurality of specific types of vehicle crash conditions, providing a signal having an identifiable electrical characteristic indicative of one of said specific types of vehicle crash conditions, and a processing circuit connectable to the crash sensor and having an output for providing an actuation signal to the occupant restraint device when the crash sensor signal indicates an occurrence of a predetermined specific type of vehicle crash condition, said test circuit comprising:

memory means connected to the processing circuit for storing a plurality of simulated crash sensor signals, each stored simulated crash sensor signal being indicative of an associated predetermined specific type of vehicle crash condition;

disabling means connected to the output of said processing circuit for disabling electrical communication between the output of the processing circuit and the actuatable occupant restraint device;

control means connected to said memory means, said disabling means, and said output of said processing circuit for controlling the disabling of electrical communication between the output from said processing circuit and the actuatable restraint device, for applying stored simulated crash sensor signals from said memory means to an input of said processing circuit, for monitoring the output of said processing circuit when any of said stored simulated crash sensor signals is applied to said processing circuit, and for determining if the monitored output signal from said processing circuit correctly responds to any of said applied stored simulated crash sensor signals; and a warning indicator connected to said control means, said control means actuating said warning indicator when said control means determines the processing circuit has not properly responded to any of said applied stored simulated crash sensor signal from said memory means.

7. A method for testing an actuatable occupant restraint system for a vehicle, said system being of a type having an actuatable occupant restraint device, a crash sensor for, when subjected to any of a plurality of specific types of vehicle crash conditions, providing a signal having an identifiable electrical characteristic indicative of one of said specific types of vehicle crash conditions, and a processing circuit having an output that provides an actuation signal to the occupant restraint device when the crash sensor signal indicates an occurrence of a predetermined specific type of vehicle crash condition, said method comprising the steps of:

storing a plurality of simulated crash sensor signals, each stored simulated crash sensor signal being indicative of an associated predetermined specific type of vehicle crash condition;

disabling electrical communication between an output of the processing circuit and the actuatable occupant restraint device;

applying any of said stored simulated crash sensor signals to an input of the processing circuit;

monitoring the output of the processing circuit when any of said stored simulated crash sensor signal is applied to the processing circuit;

determining if the monitored signal output from the processing circuit correctly responds to any of said applied stored simulated crash sensor signals; and providing a warning indication if it is determined that the processing circuit has not properly responded to any of said applied stored simulated crash sensor signals.

* * * * *

UNITED STATES PATENT AND TRADEMARK OFFICE
CERTIFICATE OF CORRECTION

PATENT NO. : 5,164,901

DATED : November 17, 1992

INVENTOR(S) : Brian K. Blackburn, Joseph F. Mazur and Scott B. Gentry

It is certified that error appears in the above-identified patent and that said Letters Patent is hereby corrected as shown below:

Column 18, Line 67, Claim 5, Change "t" to --to--.

Column 20, Line 19, Claim 6, Change "signal" to --signals--.

Column 20, Line 43, Claim 7, Change "signal" to --signals--.

Signed and Sealed this

Sixteenth Day of November, 1993

Attest:

BRUCE LEHMAN

*Attesting Officer*  *Commissioner of Patents and Trademarks*